United States Patent [19]

Trabucco

[11] Patent Number: 5,388,327
[45] Date of Patent: Feb. 14, 1995

[54] FABRICATION OF A DISSOLVABLE FILM CARRIER CONTAINING CONDUCTIVE BUMP CONTACTS FOR PLACEMENT ON A SEMICONDUCTOR DEVICE PACKAGE

[75] Inventor: Robert T. Trabucco, Los Altos, Calif.

[73] Assignee: LSI Logic Corporation, Milpitas, Calif.

[21] Appl. No.: 122,027

[22] Filed: Sep. 15, 1993

[51] Int. Cl.$^6$ .............................................. H05K 3/34
[52] U.S. Cl. ..................................... 29/830; 29/846; 228/56.3; 228/180.22; 228/253
[58] Field of Search .................. 228/180.22, 245, 253, 228/56.3; 29/830, 846

[56] References Cited

U.S. PATENT DOCUMENTS

| | | | |
|---|---|---|---|
| 3,045,441 | 10/1968 | Asher et al. | 29/627 |
| 3,429,040 | 2/1969 | Miller | 20/626 |
| 3,701,451 | 10/1972 | Schindler et al. | 220/27 |
| 3,811,186 | 5/1974 | Larnerd et al. | 29/626 |
| 3,871,014 | 3/1975 | King et al. | 357/67 |
| 3,909,838 | 9/1975 | Beyerlein | 357/70 |
| 3,984,860 | 10/1976 | Logue | 357/68 |
| 4,080,512 | 3/1978 | Ramet et al. | 174/68.5 |
| 4,100,566 | 7/1978 | Okikawa et al. | 357/70 |
| 4,120,020 | 10/1978 | Uden et al. | 361/386 |
| 4,141,030 | 2/1979 | Eisele et al. | 357/79 |
| 4,143,456 | 3/1979 | Inoue | 29/588 |
| 4,190,855 | 2/1980 | Inoue | 357/80 |
| 4,195,193 | 3/1980 | Grabbe et al. | 174/52 FP |
| 4,258,381 | 3/1981 | Inaba | 357/70 |
| 4,264,917 | 4/1981 | Ugon | 357/74 |
| 4,300,153 | 11/1981 | Hayakawa et al. | 357/80 |
| 4,330,790 | 5/1982 | Burns | 357/70 |
| 4,340,902 | 7/1982 | Honda et al. | 357/74 |
| 4,355,463 | 10/1982 | Burns | 29/827 |
| 4,363,076 | 12/1982 | McIver | 361/386 |
| 4,396,935 | 8/1983 | Schuck | 357/74 |
| 4,408,218 | 10/1983 | Grabbe | 357/70 |
| 4,412,642 | 11/1983 | Fisher, Jr. | 228/180.22 X |
| 4,460,537 | 7/1984 | Heinle | 264/272.17 |
| 4,507,675 | 3/1985 | Fujii et al. | 357/70 |
| 4,539,622 | 9/1985 | Akasaki | 361/401 |

(List continued on next page.)

FOREIGN PATENT DOCUMENTS

| | | | |
|---|---|---|---|
| 57-210638 | 12/1982 | Japan | 21/60 |
| 58-128754 | 8/1983 | Japan | 23/12 |
| 59-117244 | 7/1984 | Japan | 23/28 |
| 60-49638 | 3/1985 | Japan | 21/60 |
| 61-142750 | 6/1986 | Japan | 21/60 |
| 61-145838 | 7/1986 | Japan | 21/60 |
| 63-239827 | 10/1988 | Japan | 21/60 |
| 63-268418 | 11/1988 | Japan | . |
| 1-73753 | 3/1989 | Japan | 23/50 |
| 2-128453 | 5/1990 | Japan | 23/28 |
| WO92/11654 | 7/1992 | WIPO | 23/02 |

OTHER PUBLICATIONS

"LED Array Modules by New Technology Microbump Bonding Method", by Hatada et al., IEEE Transactions on Components, vol. 13, No. 3, Sep. 1990, pp. 521–527.

"Overmolded Plastic Pad Array Carriers (OMPAC)", by Freyman et al., IEEE, 1991, pp. 176–182.

"Pad Array Improves Density", Electronic Packaging & Production, May 1992 pp. 25–26.

*Primary Examiner*—Kenneth J. Ramsey
*Attorney, Agent, or Firm*—Honigman Miller Schwartz and Cohn

[57] ABSTRACT

A technique for simultaneously forming large numbers of solder ball (or bump) contacts on a surface of a substrate is described. A dissolvable film carrier is provided with holes arranged in a shape to correspond to an array of contact pads on a substrate. The holes are filled with solder. The film carrier retains the solder. The carrier is placed over the surface of the substrate and is heated, causing the solder to re-flow and to wet and to adhere to the contact pads. The carrier, which resists the reflow temperature, maintains the shape of the solder contacts while cooling. After cooling, the film carrier can be removed from around the solder contacts with a suitable solvent.

12 Claims, 4 Drawing Sheets

U.S. PATENT DOCUMENTS

| | | | |
|---|---|---|---|
| 4,545,610 | 10/1985 | Lakritz et al. | 29/589 |
| 4,587,550 | 5/1986 | Matsuda | 357/79 |
| 4,594,770 | 6/1986 | Butt | 29/588 |
| 4,620,215 | 10/1986 | Lee | 357/81 |
| 4,631,805 | 12/1986 | Olsen et al. | 29/588 |
| 4,680,617 | 7/1987 | Ross | 357/72 |
| 4,688,152 | 8/1987 | Chia | 361/408 |
| 4,700,276 | 10/1987 | Freyman et al. | 361/403 |
| 4,700,473 | 10/1987 | Freyman et al. | 29/846 |
| 4,705,205 | 11/1987 | Allen et al. | 228/180.22 |
| 4,705,917 | 11/1987 | Gates, Jr. et al. | 174/52 FP |
| 4,712,721 | 12/1987 | Noel et al. | 228/245 X |
| 4,717,066 | 1/1988 | Goldenberg et al. | 228/179 |
| 4,763,188 | 8/1988 | Johnson | 357/74 |
| 4,771,330 | 9/1988 | Long | 357/80 |
| 4,772,936 | 9/1988 | Reding et al. | 357/80 |
| 4,788,767 | 12/1988 | Desai et al. | 29/830 X |
| 4,800,419 | 1/1989 | Long et al. | 357/70 |
| 4,803,546 | 2/1989 | Sugimoto et al. | 357/81 |
| 4,825,284 | 4/1989 | Soga et al. | 357/80 |
| 4,857,483 | 8/1989 | Steffen et al. | 437/209 |
| 4,868,349 | 9/1989 | Chia | 174/52.4 |
| 4,872,825 | 10/1989 | Ross | 425/117 |
| 4,874,722 | 10/1989 | Bednarz et al. | 437/209 |
| 4,890,152 | 12/1989 | Hirata et al. | 357/72 |
| 4,890,194 | 12/1989 | Derryberry et al. | 361/386 |
| 4,913,930 | 4/1990 | Getson | 427/58 |
| 4,926,241 | 5/1990 | Carey | 357/75 |
| 4,933,741 | 6/1990 | Schroeder | 357/70 |
| 4,935,581 | 6/1990 | Komathu | 174/52.4 |
| 4,949,225 | 8/1990 | Sagisaka et al. | 361/414 |
| 4,955,132 | 9/1990 | Ozawa | 29/840 |
| 4,961,105 | 10/1990 | Yamamoto | 357/72 |
| 4,965,702 | 10/1990 | Lott et al. | 361/401 |
| 4,970,575 | 11/1990 | Soga et al. | 357/72 |
| 4,970,577 | 11/1990 | Ogihara et al. | 357/74 |
| 4,972,253 | 11/1990 | Palino et al. | 357/74 |
| 4,974,057 | 11/1990 | Tazima | 357/72 |
| 4,975,765 | 12/1990 | Ackermann et al. | 357/80 |
| 4,982,265 | 1/1991 | Watanabe et al. | 357/75 |
| 4,984,059 | 1/1991 | Kubota et al. | 357/68 |
| 4,985,748 | 1/1991 | Belanger, Jr. | 357/69 |
| 4,996,587 | 2/1991 | Hinrichsmeyer et al. | 357/74 |
| 5,006,673 | 4/1991 | Freyman et al. | 174/255 |
| 5,006,919 | 4/1991 | Disko | 357/72 |
| 5,012,386 | 4/1991 | McShane et al. | 361/386 |
| 5,025,114 | 6/1991 | Braden | 174/52.4 |
| 5,031,069 | 7/1991 | Anderson | 361/321 |
| 5,047,837 | 9/1991 | Kitano et al. | 357/81 |
| 5,048,166 | 9/1991 | Wakamatsu | 29/830 |
| 5,077,633 | 12/1991 | Freyman et al. | 361/403 |
| 5,111,279 | 5/1992 | Pasch et al. | 357/81 |
| 5,126,278 | 6/1993 | Lin et al. | 257/688 |
| 5,153,379 | 10/1992 | Guzuk et al. | 174/35 R |
| 5,153,385 | 10/1992 | Juskey et al. | 174/260 |
| 5,172,303 | 12/1992 | Bernardoni et al. | 361/396 |
| 5,195,023 | 3/1993 | Manizone et al. | 361/392 |

FABRICATION OF A DISSOLVABLE FILM CARRIER CONTAINING CONDUCTIVE BUMP CONTACTS FOR PLACEMENT ON A SEMICONDUCTOR DEVICE PACKAGE

TECHNICAL FIELD OF THE INVENTION

The invention relates to semiconductor device assemblies, and more particularly to techniques for forming external connections (namely, raised ball bump type contacts) on an exterior surface of a semiconductor package.

BACKGROUND OF THE INVENTION

The semiconductor industry has seen tremendous advances in technology in recent years which have permitted dramatic increases in circuit density and complexity, and equally dramatic decreases in power consumption and package sizes. Present semiconductor technology now permits single-chip microprocessors with many millions of transistors, operating at speeds of tens (or even hundreds) of MIPS (millions of instructions per second) to be packaged in relatively small, air-cooled semiconductor device packages. A by-product of such high-density and high functionality in semiconductor devices has been the demand for increased numbers of external electrical connections to be present on the exterior of the semiconductor packages, for connecting the packaged device to external systems (such as via a printed circuit board). Traditional packaging techniques involving pins, leads and the like are inadequate to the task.

A number of newer interconnection technologies have been used, with varying degrees of success, to increase connection densities above those of older techniques (e.g., the relatively low-density DIP or Dual Inline Package connection technique). These newer techniques are represented primarily by solder-reflow surface-mount technologies such as: PQFP (Plastic Quad Flat Pack), SOIC (Small Outline Integrated Circuit), LCC's (Leadless Chip Carriers), J-lead packages, etc., although a few high-density non-surface-mount techniques (e.g., PGA—Pin Grid Array) have also been used. Among the newer surface mounting techniques is a type of package on which a plurality of ball-shaped conductive bump contacts (usually solder, or other similar conductive material) are disposed. Such packages are occasionally referred to as "Ball Grid Array" (BGA) or "Area Grid Array" packages—the solder balls on the exterior surface of the package typically being arranged in a rectangular array.

A typical BGA package is characterized by a large number (potentially several hundreds) of solder balls disposed in an array on a surface of the package. The BGA package is assembled to a matching array of conductive pads (presumably connected to other circuitry) on a substrate or circuit board. Heat is applied to reflow the solder balls (bumps) on the package, thereby wetting the pads on the substrates and, once cooled, forming electrical connections between the package (and the semiconductor device contained in the package) and the substrate.

The introduction of the Ball Grid Array (BGA) package to the semiconductor industry has brought with it several new package manufacturing and assembly problems. One of the more significant problems is finding an efficient, cost-effective technique for applying the solder ball contacts to the package surface. The package surface is usually formed from an electrically insulating material (e.g., printed circuit board material) with a pattern of metallized pads disposed thereupon connecting to circuity on a semiconductor device within the package. Several methods are currently used to dispose solder balls or conductive bump contacts to these package pads.

One method of disposing solder balls or conductive bump contacts on package pads involves the application of solder flux to the package pads, then placing preformed solder balls onto the package pads, either individually or en masse, with the aid of a fixture or a "pick-and-place" apparatus similar to those used for circuit board assembly. The package is then heated to the melting point of the solder ball alloy which will then wet the metallic surface of the pads and make electrical contact therewith.

This pick-and-place method requires the precision handling of massive quantities of solder balls. As the connection counts of packages increase, hundreds or even thousands of balls must be manipulated in this fashion for each package.

An alternative method of disposing solder balls or conductive bump contacts on package pads involves using a printing or dispensing fixture to apply measured quantities of solder paste (a mixture of fine solder particles in a flux-containing medium) to the package contact pads. Upon exposure to heat, the solder melts and surface tension causes the solder to assume a generally spherical shape. Once cooled, the spherical shapes form the "ball grid" contacts of the package. Evidently, ball bump type contacts formed in this manner, being generally spherical, will exhibit a 1:1 aspect ratio of height-to-width. Even if hemispherical, the ball bump type contacts will have a height:width ratio on the order of 0.5:1. In certain applications, it would be desirable that the external package contacts have a height:width ratio in excess of 1:1 (e.g., 2:1).

Another technique for disposing solder balls or conductive bump contacts on package pads involves using printed solder paste, then placing a preformed ball, which is essentially a combination of the two techniques described hereinabove. In this technique, solder is printed onto the contact pad to form an "adhesive" on the contact pad, then a pre-formed solder ball is placed onto the contact pad.

Difficulties with the technique of measuring or dispensing quantities of solder paste on pads to form ball bump contacts include dealing with the rheological characteristics (elasticity, viscosity, plasticity) of the solder paste, accurately controlling the volume of solder paste after dispensing and reflow, and the shape of the final ball contact. The shape of the ball contact can be affected by such factors as surface tension of the molten solder and the amount of wettable exposed metal area of the contact pad.

The generally spherical shape assumed by solder balls formed as described hereinabove prevents the formation of "tall" contacts by ordinary means. In certain applications, tall solder bumps or ball contacts can be used to great advantage in reflow assembly (e.g., of a packaged semiconductor device to a printed circuit board). As mentioned above, in general it is difficult to form contacts with height-to-width ratios (aspect ratios) of greater than 1:1. Some techniques involving "building up" of solder contact height in a series of process steps have managed to produce tall contacts, but such techniques are expensive and cumbersome in high-volume production.

Consistency in the height of solder ball contacts is another critical factor for successful assembly of BGA-type packages to circuit boards. If one or more balls are significantly shorter than others (usually due to an insufficient amount of solder paste deposited on one or more conductive pads prior to contact formation) it becomes highly likely that these smaller (shorter) contacts will completely miss their mating contact pads (on the circuit board) and will fail to form an electrical connection between the packaged semiconductor device and the underlying substrate (e.g., printed circuit board). Hence, quality control for BGA packages is critical, since proper electrical connections between the BGA package and the substrate to which it is assembled are formed only if each and every one of the solder ball contacts reflows correctly and wets its associated conductive pad on the substrate. Defective assemblies of packages to substrates can be difficult or impossible to repair after assembly if connections are not properly formed. Even prior to assembly, the correction of improperly formed solder ball type contacts on the exterior of a package can be very difficult and involves, initially, careful quality control inspection of the ball bump contacts prior to assembly of the packaged device to a substrate.

As the volume of packages produced by the aforementioned methods increases, the complexity of the manufacturing processes becomes an obstacle to high manufacturing rates. In order to avoid high scrap rates, high machine accuracy must be maintained, raw material properties (e.g., solder paste and pad metal) must be carefully controlled, and numerous process parameters (e.g., amount of solder paste dispensed, size of conductive pads, temperature, shape and size of ball contact) must be monitored.

Further complicating matters, in order to accommodate different package configurations (e.g., different size packages, different array spacing of the ball bump contacts, etc.), it may be necessary to change numerous parts of the manufacturing equipment (tooling). Generally speaking, complicated setup and tooling changes tend to increase downtime, thereby increasing production cost.

DISCLOSURE OF THE INVENTION

It is therefore an object of the present invention to provide an improved technique for forming conductive ball (or bump) contacts on a surface of a substrate. Generally, hereinafter, although "balls" may be referred to, it should be understood that other, non-spherical geometries of raised solder contacts ("bumps") are intended.

It is a further object of the present invention to provide a technique suited to forming large numbers of conductive ball contacts on a surface of a substrate.

It is another object of the present invention to provide a technique for forming a large number of conductive ball (or bump) contacts on a substrate simultaneously.

It is another object of the present invention to provide a technique for forming large numbers of conductive ball (or bump) contacts of uniform height.

It is another object of the present invention to provide a technique for forming high aspect (height:width) ratio conductive ball (or bump) contacts.

It is another object of the present invention to accomplish the foregoing objects in a minimum number of process steps.

It is another object of the present invention to accomplish the foregoing object in a process which requires a minimal amount of manufacturing time.

It is another object of the present invention to accomplish to foregoing objects inexpensively.

It is another object of the present invention to provide a technique which accomplishes the foregoing objects in a manner suited to high-volume production.

According to the invention, a film carrier strip is provided (impressed) with a pattern of holes corresponding to the positions of solder bump contacts to be formed on a substrate. The holes are then filled with solder which is retained by the film carrier. The holes can be filled by casting molten solder therein, by filling them with solder paste (and optionally re-flowing and hardening the solder paste in the carrier), by disposing pre-formed solder contacts (balls, pellets, or slugs) in the holes, or by any other suitable means.

The holes (and therefore the solder in the holes) are arranged in a pattern corresponding to a pattern of contact pads on a surface of a substrate upon which solder bump (ball) contacts are to be disposed (formed). The film carrier (with the integral solder contacts) is positioned over the surface of the substrate such that the holes in the carrier line up over corresponding contact pads on the substrate. Preferably, the surface of the substrate has been prepared with a thin coating of solder flux (to aid the "wetting" action of the solder) prior to positioning the film carrier thereover.

The substrate and film carrier are then heated to a temperature at which the solder in the carrier re-flows, wetting the contact pads and adhering firmly thereto. After re-flowing the solder, the assembly is cooled. The film carrier is then removed, leaving behind raised solder contact structures on the surface of the substrate. Preferably, the film carrier is dissolvable, and is removed by a suitable solvent.

According to an aspect of the invention, the holes in the dissolvable film carrier can be straight-walled (i.e., parallel walls, perpendicular to the surface of the film carrier), or can have a "waisted" or conical shape. A "waisted" shape is one which narrows in the middle, suggestive of a waist. With a dissolvable film carrier, it is possible to remove the film carrier even though the solder structures formed on the substrate surface do not have a "draft". As mentioned, waisted solder structures can be formed on a substrate in this manner.

According to an aspect of the invention, the dissolvable film carrier is made by forming a substantially flat film of a dissolvable material. The dissolvable material can be soluble in water, or in another suitable solvent, but must maintain its structural integrity at the elevated re-flow temperature of the solder. The dissolvable film can be formed by any suitable technique, such as hardening or "developing" a thin film layer of a suitable (e.g., resinous) material by exposure to ultraviolet light. Holes are formed in the film and are subsequently filled with a conductive, re-flowable material (e.g., solder). The conductive, re-flowable material can be a solder paste, or a solid solder alloy. In the case of the solid solder alloy, molten solder can be introduced into the holes and allowed to be formed or cast in place in the holes upon cooling.

Further according to the invention, the dissolvable carrier may not be removed immediately after being used to form raised contacts (solder balls or bumps) on a substrate. The film carrier can simply be left in place on the substrate after the raised solder contacts are formed on the substrate, in which case the carrier film can function as a spacer in subsequent assembly of the substrate (e.g., a semiconductor package) to another substrate (e.g., a printed circuit board). In such a case, the ball-bumped substrate (semiconductor package having raised contact structures on an external surface thereof) would be positioned over the printed circuit board (PCB) such that the solder structures in the carrier film holes lines up over corresponding contact pads on the PCB. The PCB and ball-bumped package would then be heated so that the solder (raised contact structures) re-flow, thereby forming electrical connections to the contact pads on the P.C. board (or other substrate). The dissolvable carrier can then be left in place, or can be removed with a suitable solvent. An advantage of leaving the film carrier in place during assembly of the ball-bumped package to a PCB is that the film carrier can act as a standoff element, ensuring a predetermined spacing between the opposing surfaces of the package and the PCB.

The technique of the present invention is well suited to handling large numbers of solder bump contacts at low cost, with a minimal number of process steps. By direct casting of the contacts it is possible to ensure uniform contact height. By choosing appropriate hole size and carrier thickness, it is possible to create contact structures having virtually any aspect ratio (height-to-width ratio).

Since all of the raised contacts are formed simultaneously on the substrate (external surface of a semiconductor package), the technique of this invention is ideally suited to high-volume, low-cost production.

As mentioned hereinabove, it is also contemplated that solid pellets can be placed in the holes of the film carrier. Although this would seem a bit more cumbersome than casting the solder structures in the holes, the process can be done off-line (i.e., film carriers can be pre-loaded with pellets) to increase productivity.

An additional advantage of the technique of this invention is that the thickness of the film carrier is readily selected to correspond to a desired height of the raised contact structure desired to be formed on the surface of the substrate.

An additional advantage of the technique of this invention is that the dimension (e.g., diameter) of the holes in the film carrier can readily be selected to correspond to a desired width of the contact structures sought to be formed on the surface of the substrate.

An additional advantage of the technique of this invention is that the pattern and spacing of the holes in the film carrier can readily be selected to correspond to a desired pattern and spacing of the contract structures sought to be formed on the surface of the substrate.

An additional advantage of the technique of this invention is that the holes in the film carrier can readily be formed so that selected contact structures ultimately formed on the surface of a substrate are of different shape or size.

Other objects, features and advantages of the invention will become apparent in light of the following description thereof.

DETAILED DESCRIPTION OF THE INVENTION

Figure 1:
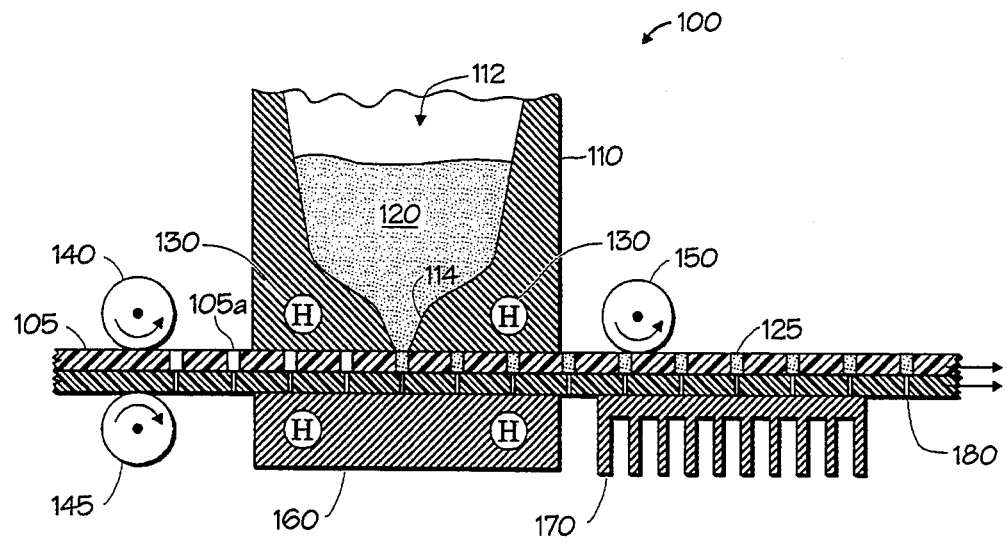
FIG. 1 is a diagram of apparatus for casting solder bump contacts in a dissolvable film carrier, according to the invention.

According to the invention, a preferably-dissolvable film carrier is impressed with a pattern of holes corresponding to the positions of solder bump contacts to be formed. The holes are then filled with solder which is retained by the film carrier, forming solder bump structures to be applied to a surface of a substrate (e.g., such as to an external surface of a semiconductor package). The solder is disposed within the holes by placing pre-formed pieces, by filling the holes with molten solder and permitting it to cool, by filling the holes with solder paste and re-flowing the paste, or by any other suitable means. In cases where the solder contacts are formed within the film carrier (e.g., by casting them from molten solder or by re-flowing solder paste, as opposed to placing pre-formed contacts within the holes) the solder contacts take on the shape of the holes in the film carrier.

Since the solder contacts are either pre-formed (e.g., by prior casting, or the like) or are "molded" in the holes in the carrier, it is possible to obtain contact shapes which are either difficult or impossible to obtain otherwise. For example, contacts with virtually any aspect ratio can be provided (e.g., "tall" contacts with greater than 1:1 height to width ratio). Conical shapes can also be readily formed. "Waisted" shapes (e.g., hourglass) can be obtained with the molten solder or reflow techniques. Evidently the holes in the carrier must be formed according to the contact shape desired.

The film carrier is preferably formed of a dissolvable material; preferably one which is soluble in either water, a conventional cleaning solvent or other cleaning solution.

Suitable materials for forming the film carrier include: aliphatic acrylate monomer (2,2-dimethoxy-2-phenyl-acetophenone), aliphatic acrylic polymer, which are water soluble; styrene plastics, which are soluble in acetone, to name but a few suitable materials. Suitable solvents include, water, acetone and flux solvents such as CFCs and turpenes. Generally, sugar-based and starch-based materials for the film carrier will be dissolvable in water, and various polymers will require a solvent. One skilled in the art to which the present invention most nearly pertains will recognize that the choice of material for the film carrier must be accompanied by the choice of a suitable solvent for the chosen film carrier material.

The solder contacts are generally formed in arrays of holes in the film carrier corresponding to a pattern (array) of contact pads on the surface of a substrate. Once the solder contacts are in place in the film carrier, the film carrier can be sectioned (i.e., diced) into contact "wafers" for application to one or more packages. (It will be readily appreciated by one of ordinary skill in the art that the carrier can be sectioned to accommodate application to more than one package per section).

The contact wafer (diced film carrier) containing the solder contacts is placed on a surface of a substrate (e.g., package, PCB, semiconductor die, or any other suitable surface) that preferably has been coated with a thin layer of solder flux, such that the solder contacts align with corresponding conductive (metallic) contact pads on the substrate surface. The assembly of contact wafer and substrate is then placed in a solder reflow oven, batch oven, hot gas source, or other suitable means of elevating the temperature of the assembly to the melting point of the solder contacts. Upon melting, the solder wets the exposed metal contact pads on the substrate, causing the solder to adhere to the contacts. The wafer, which does not melt, holds the solder in position over the contact pads while the raised solder contacts on the contact pads are being formed.

After cooling, the solder contacts harden. The wafer may then be removed, by dissolving with a suitable solvent, such as those describe above. Preferably, the wafer is dissolved with a cleaning agent, such as flux-removal solvent.

It should be recognized that the term "solder", as used herein, refers to any conductive, re-flowable material suitable for forming electrical connections, and refers to tin-lead alloys such as are widely used in the electronics industry for electrical connections, but other formulations (e.g., indium solder, silver solder, etc.) are equally applicable with appropriate adjustments in re-flow temperature, etc.

FIG. 1 shows an example of apparatus 100 suitable for casting solder bump contacts 125 in a film carrier 105. Holes 105a in the carrier are formed to receive the solder contacts 125. Drive rollers 140, 145, and 150 move the film carrier 105 along a transport belt 180. A crucible 110 is heated by heating elements ("H") 130. Solder 120 in a cavity 112 of the crucible 110 is maintained in a molten state by the heat from the heating elements H. Heat is also applied to the film carrier 105 by a heated block 160 underneath the transport belt 180. An opening 114 in the crucible 110 permits molten solder 120 to flow into the holes 105a in the film carrier 105 as they pass by (under) the opening 114. After passing the crucible 110, the carrier and molten solder is cooled, as illustrated by an element having cooling fins 170. The process flow in FIG. 1 is from left to right, as viewed.

The molten solder 120 cast into the holes 105a hardens upon cooling (170) to form slug-like solder bump contact structures 125, which are retained by the holes in the film carrier. It will be readily appreciated by one of ordinary skill in the art that the apparatus shown in FIG. 1 is merely exemplary of many different possible similar techniques for casting the solder contacts in the holes of the belt.

Ultimately, the film carrier is diced into wafer sections which are positioned on the surface(s) of one or more substrates so that the solder bump contact structures can be transferred from the film carrier to the surface(s) of the substrate(s).

Figure 2:
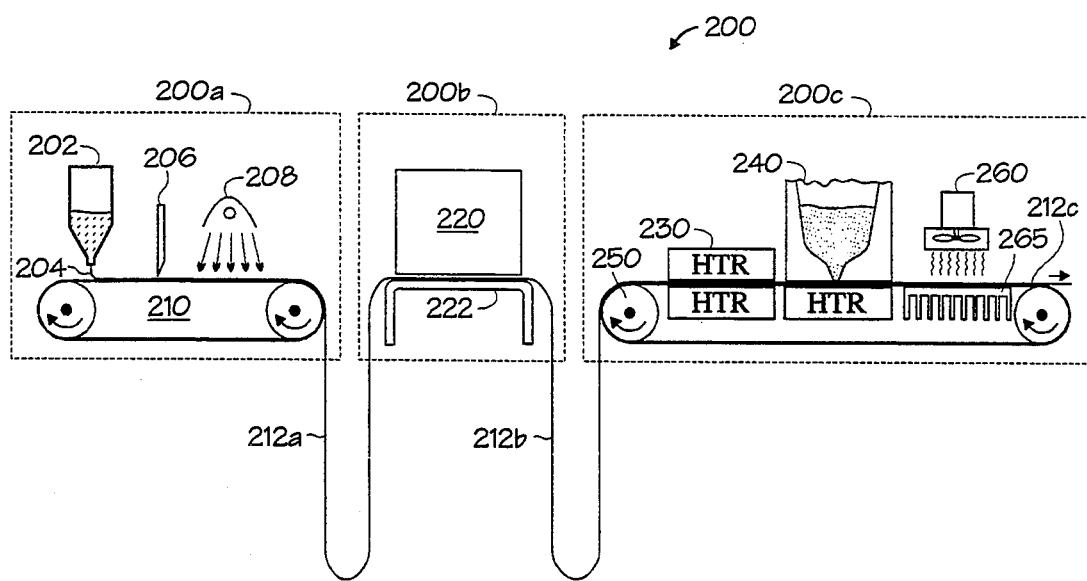
FIG. 2 is a block diagram of apparatus for forming a film carrier, for impressing a pattern of holes in the film carrier, and for casting solder bump contacts in the holes, according to the invention.

FIG. 2 is a block diagram of apparatus 200 for forming a film carrier, impressing a pattern of holes in the film, and casting solder bump contacts in the holes, according to the invention. The apparatus 200 comprises three major sections: a film-forming section 200a where the film carrier 212a is formed, a hole-forming section 200b where holes (compare 105a, FIG. 1) are formed in the film carrier 212a to provide a patterned carrier 212b (compare 105, FIG. 1), and a casting section 200c (compare crucible 110, etc, of FIG. 1), where the solder bump contacts are molded or "cast" in the holes of the patterned carrier 212b to form contact wafers 212c (dissolvable film carrier for conductive bump contacts).

In the film forming section 200a, a film-forming material in a reservoir 202 is disposed in a thin layer 204 over a surface of a transport apparatus 210 (e.g., a conveyor belt). A knife-edge 206 positioned downstream of the reservoir and close to the conveyor belt "scrapes" ("doctors") the thin layer 204 to a uniform thickness. The resultant uniform-thickness layer 204 (to the right of the knife-edge 206, as viewed in FIG. 2) is then developed (hardened or congealed) using an ultraviolet light source 208 (or heat source, or the like, depending on the material of the film carrier) to form a uniform-thickness, solid film carrier 212a. It will be readily appreciated by one of ordinary skill in the art that this specific technique applies to films which can be developed by ultraviolet light and is merely representative of film forming processes. Other materials may require different film forming techniques. For example, applying heat (typically supplied by an infrared source) to an uncured material is a common technique for curing the material. It will also be understood that the film 212a should be releasable from the belt of the transport apparatus 210, and those skilled in the art to which the present invention most nearly pertains will understand which film carrier materials should and should not be combined with which transport apparatus (i.e., conveyor belt) materials, and that a release agent may be required on the surface of the conveyor belt. The release coating could also be a backing (support) material that releases from the conveyor belt but remains with the cured film until it is removed (peeled off of the back of the cured film) by the user. This would be particular advantageous if the film carrier itself lacks sufficient strength for the further processing (e.g., forming holes, filling the holes with solder, etc.), in which case the release backing would provide additional, interim mechanical support for the relatively flimsy film carrier.

The solid film carrier 212a next passes into the hole-forming section 200b where holes are formed through the film. As shown, a punch mechanism 220 and die 222 are used to form the holes in the film carrier 212a to provide a patterned film 212b at the output of the hole-forming section 200b. It will readily be appreciated by one of ordinary skill in the art that there are many possible techniques for patterning a film with holes, and that the punch and die technique shown in FIG. 2 is merely representative of these techniques. Again, one skilled in the art to which the invention most nearly pertains will understand to make this choice depending on the material and thickness of the film carrier, as well as the size holes sought to be formed in the film carrier.

The patterned film 212b next passes into a contact-casting section 200c of the apparatus, which is suitably similar to that shown as 100 with respect to FIG. 1. A transport mechanism 250 (e.g., conveyor belt, rollers, etc.) carries the patterned film 212b with holes formed therein through the casting apparatus 200c. Heaters 230 pre-heat the film 212b prior to passing through a casting apparatus 240 (compare crucible 110 of FIG. 1) wherein molten solder is introduced into the holes in the patterned film 212b (compare FIG. 1). Cooling means, such as a fan 260 and cooling fins 265 (compare 170, FIG. 1) cool the film and molten solder, thereby hardening (solidifying) the solder into individual contact structures to be transferred to the surface of a substrate. The contact-containing film 212c next exits the apparatus 200, after which it can be cut up into "wafer" sections of sizes suitable for applying the contact structures to one or more substrates.

Figure 3:
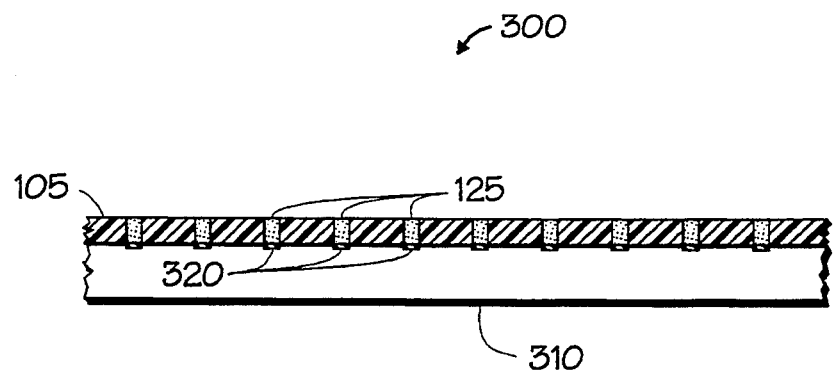
FIG. 3 is a partial view of a film carrier, with cast solder contacts in the holes, disposed upon a surface of a package substrate, according to the invention.

FIG. 3 is a partial view of a process of transferring the contact structures from the film carrier 105 (or 212c) with cast solder contacts 125 to a surface of a substrate 310. As mentioned hereinabove, the substrate is suitably a semiconductor package upon an external surface of which it is desired to form raised contact structures. The substrate 310 has metallic electrical contact pads 320 disposed on its contact-receiving surface. Preferably, prior to assembly, the surface of the substrate 310 is treated with a thin coating of solder flux to promote wetting of the metallic contact pads 320 by the solder contacts 125. The contact-containing wafer (dissolvable film carrier 105 and contacts 125) is then placed in contact with the substrate 310 as shown in the Figure such that the solder contacts 125 line up over corresponding contact pads 320. The assembly 300 (of substrate 310 and carrier 105) is then heated by any suitable means to re-flow the solder contacts 125, which wet the metal of and adhere firmly to the contact pads 320. The dissolvable carrier 105 maintains the shape of the solder contacts 125 while the solder is in a molten state, and forms the shape of the contacts 125 when they cool. In other words, the size and shape of the holes in the film carrier determine the ultimate size and shape of the contact structures formed on the surface of the substrate.

Figure 4:
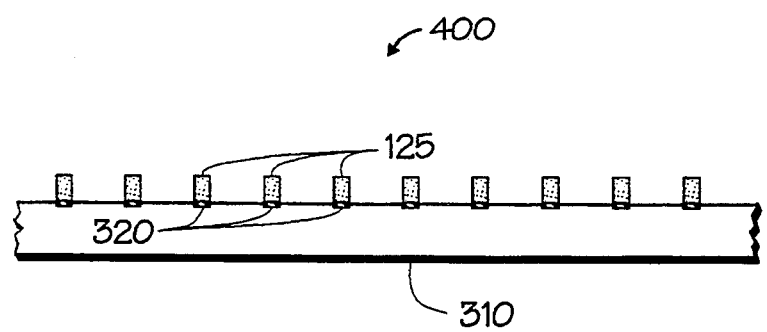
FIG. 4 is a partial view of the substrate of FIG. 3 after reflow of the solder contacts and removal (e.g., dissolution) of the film carrier, according to the invention.

After cooling, the dissolvable carrier 105 is removed with a suitable solvent, as discussed hereinabove, leaving the contacts structures 125 behind (now firmly joined to corresponding contact pads 320 on the substrate 310). This is shown generally as 400 in FIG. 4, which is a view of the assembly 300 of FIG. 3 after reflow of the solder contacts 125 and dissolution of the film carrier 105.

Alternatively, the dissolvable carrier 105 can be left in place after reflow of the contacts 125 to serve as a spacer for subsequent assembly of the substrate to another substrate or PCB. This is shown and described hereinbelow with respect to FIGS. 5 and 6.

Figure 5:
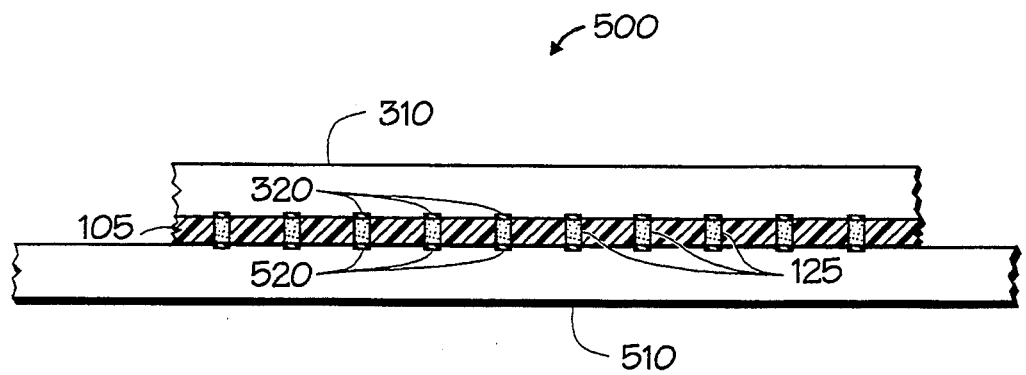
FIG. 5 is a partial view of a package substrate with a dissolvable film carrier still on its surface, resting on a printed circuit board, according to the invention.

FIG. 5 shows an assembly 500 of a substrate 310, carrier 105 and contacts 125 to a PCB 510. The PCB 510 has conductive contact pads 520 (corresponding in position to the contact pads 320 on the substrate 310) disposed on a surface thereof. Preferably, the contact pad bearing surface of the PCB 510 is treated with a thin coating solder flux prior to assembly. The substrate assembly (300, FIG. 3, comprising substrate 310, contact pads 320, contacts 125, and carrier 105) is positioned in a face-to-face, contacting orientation over the PCB such that the solder contacts 125 line up with corresponding contact pads 520 on the P.C. board. The temperature of the assembly 500 is then elevated to the melting point of the solder contacts 125, thereby reflowing the contacts and causing them to wet the contact pads 520 and to adhere firmly thereto upon cooling. As before, the carrier 105 maintains the shape of the contacts 125 while they are in the molten state. After cooling, the carrier 105 can be removed with a suitable solvent. Preferably, the carrier 105 is soluble in a solvent (aqueous or otherwise) which is used to clean the assembly 500 after soldering so that cleaning of the assembly (e.g., to remove residual flux) and removal of the carrier 105 can be accomplished in a single operation.

Figure 6:
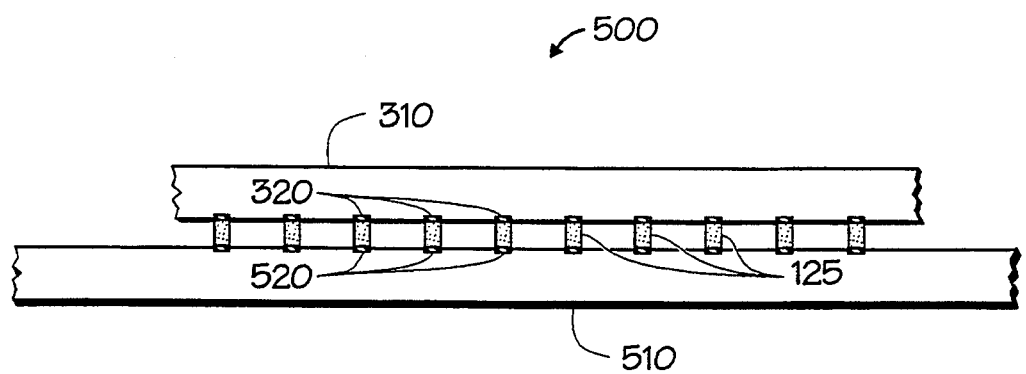
FIG. 6 is a partial view of the assembly of FIG. 5 after reflow of solder contacts and dissolution of the film carrier, according to the invention.

FIG. 6 shows the assembly 500 after removal of the carrier 105. The now-hardened contacts 125 provide both mechanical and electrical connections between the contact pads 320 on the substrate 310 and the contact pads 520 on the P.C. board 510.

Although the holes (e.g. 105a, FIG. 1) in the dissolvable carrier have generally been shown and described as straight-walled holes, it will be evident to one of ordinary skill in the art that other hole shaped can be formed by a variety of techniques. Assuming that the carrier (e.g., 105) is sufficiently plastic (formable) then the punch and die arrangements shown and described hereinbelow with respect to FIGS. 7a and 7b can be used to form "waisted" and conical hole shapes.

Figure 7A:
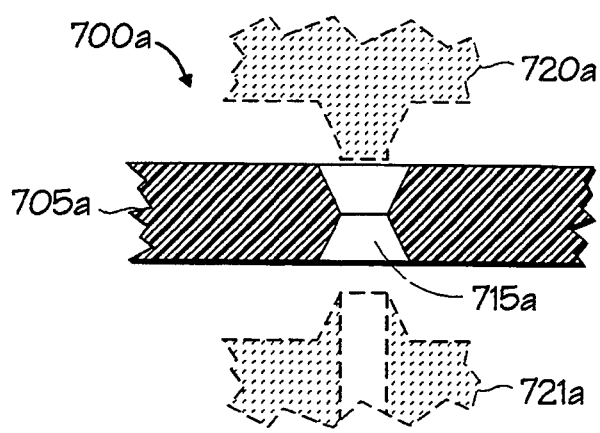
FIG. 7a is a cross-sectional view of a "waisted" hole formed in a film carrier, according to the invention.
Figure 7B:
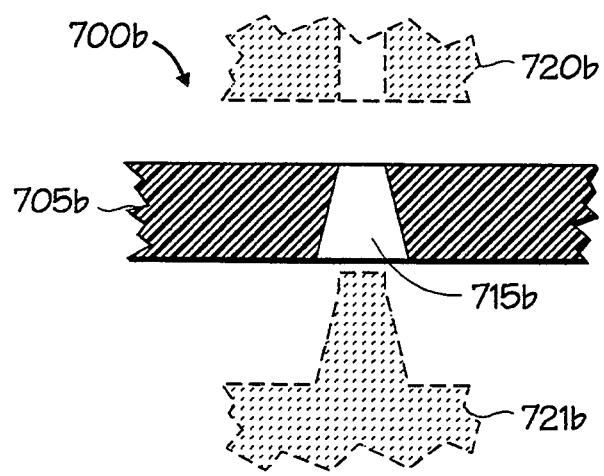
FIG. 7b is a cross-sectional view of a conical hole formed in a film carrier, according to the invention.

FIG. 7a is a cross sectional view 700a of a dissolvable film carrier 705a in which a "waisted" hole 715a has been formed. (The term "waisted" refers to the central narrowing of the hole 715a in a sort of hourglass shape suggestive of a "waist"). A punch shape 720a and die shape 720b for forming the hole 715a is shown in dashed lines. FIG. 7b is a cross-sectional view 700b of a dissolvable film carrier 705b in which a conical hole 715b has been formed. A punch shape 720b and die shape 720b for forming the hole 715b is shown in dashed lines.

One of ordinary skill in the art will readily appreciate that the holes in the carrier can be formed by many different means. For example, the holes can be formed in the film prior to hardening (e.g., by UV light as shown in FIG. 1). Depending upon the film material, it is also possible to thermally impress the holes in the film (e.g., by hot stamping or pressing). It will also be readily appreciated that by choosing appropriate film thickness and hole dimensions, solder contacts having virtually any aspect ratio (height to width ratio) can be formed.

By employing the techniques described hereinabove, it is possible to form packages and assemblies with very large numbers of solder contacts in a very small number of process steps. By eliminating the manipulation of individual contacts structures, considerable cost is saved. Further, "tall" contacts can be readily formed in large numbers without repeated "build-up" steps.

One skilled in the art to which the present invention most nearly pertains will understand that many variations of the techniques presented hereinabove are possible, and fall within the scope and spirit of the present invention. For example, the holes in the carrier can be formed by punching, or by directing a stream of compressed air or water at the carrier, or by directing a laser beam at the carrier, or by photo-processing the carrier. It is likewise within the scope of this invention that the carrier, with holes, could be formed using a completely different technology such as compressed powder techniques (such as are commonly used in forming pills). For actively forming the film carrier from a viscous matrix, techniques such as dribbling the matrix onto a moving belt and establishing a prescribed thickness with a doctor blade is also possible. Additionally, the matrix could be sprayed onto a substrate with a nozzle, then cured.

What is claimed is:

1. A method of fabricating a film carrier containing conductive bump contacts for placement on a semiconductor device package, comprising the steps of:
    forming a non-conductive film of a desired thickness;
    curing the non-conductive film;
    forming holes in the non-conductive film of a desired pattern and size;
    forming conductive contacts in the holes of the non-conductive film comprising the steps of,
        casting a molten metal into the holes of the non-conductive film,
        solidifying the molten metal to form conductive contacts; and
    cutting the non-conductive film containing the conductive contacts into desired shapes.

2. The method of claim 1, wherein the step of forming a non-conductive film is the step of forming a non-conductive dissolvable film.

3. The method of claim 1, wherein the step of curing is the step of curing with an ultra violet light.

4. The method of claim 1, wherein the step of curing is the step of heating with an infrared light.

5. The method of claim 1, wherein the step of forming conductive contacts comprises the steps of:
    heating molten solder in a crucible;
    heating the non-conductive film;
    flowing molten solder into the holes in the non-conductive film; and
    cooling the molten solder in the holes until solidified.

6. The method of claim 1, further comprising the step of applying a support backing to the non-conductive film while it is being formed.

7. An apparatus for fabricating a film carrier containing conductive bump contacts for placement on a semiconductor device package, comprising:
    means for forming a non-conductive film of a desired thickness;
    means for curing the non-conductive film;
    means for forming holes in the non-conductive film of a desired pattern and size;
    means for forming conductive contacts in the holes of the non-conductive film comprising the steps of,
        means for casting a molten metal into the holes of the non-conductive film,
        means for solidifying the molten metal to form conductive contacts; and
    means for cutting the non-conductive film containing the conductive contacts into desired shapes.

8. The apparatus of claim 7, wherein the means for forming a non-conductive film is the means for forming a non-conductive dissolvable film.

9. The apparatus of claim 7, wherein the curing means is an ultra violet light.

10. The apparatus of claim 7, wherein the curing means is an infrared light.

11. The apparatus of claim 7, wherein the means for forming conductive contacts comprises:
    means for heating molten solder in a crucible;
    means for heating the non-conductive film;
    means for flowing molten solder into the holes in the non-conductive film; and
    means for cooling the molten solder in the holes until solidified.

12. The apparatus of claim 7, further comprising means for applying a support backing to the non-conductive film while it is being formed.

* * * * *